United States Patent
Quintanilha

(10) Patent No.: US 10,222,709 B2
(45) Date of Patent: Mar. 5, 2019

(54) METROLOGY METHOD, METROLOGY APPARATUS AND DEVICE MANUFACTURING METHOD

(71) Applicant: ASML NETHERLANDS B.V., Veldhoven (NL)

(72) Inventor: Richard Quintanilha, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 116 days.

(21) Appl. No.: 15/013,756

(22) Filed: Feb. 2, 2016

(65) Prior Publication Data

US 2016/0223476 A1      Aug. 4, 2016

(30) Foreign Application Priority Data

Feb. 4, 2015   (EP) ..................................... 15153825

(51) Int. Cl.
*G01N 23/083* (2018.01)
*G03F 7/20* (2006.01)

(52) U.S. Cl.
CPC ...... *G03F 7/70591* (2013.01); *G03F 7/70625* (2013.01); *G03F 7/70633* (2013.01)

(58) Field of Classification Search
CPC ............. G03F 7/70591; G03F 7/70625; G03F 7/70633; G01N 23/20; G01N 23/201;
(Continued)

(56) References Cited

U.S. PATENT DOCUMENTS

| 5,406,609 | A | | 4/1995 | Arai et al. |
| 6,011,611 | A | * | 1/2000 | Nomura ................... G03F 7/706 355/53 |

(Continued)

FOREIGN PATENT DOCUMENTS

| JP | 2007-285923 | 11/2007 |
| WO | 2009/078708 | 6/2009 |

(Continued)

OTHER PUBLICATIONS

International Search Report and Written Opinion dated May 30, 2016 in corresponding International Patent Application No. PCT/EP2016/050098.

P. Lemaillet et al., "Intercomparison between optical and x-ray scatterometry measurements of FinFET structures," Proc. of SPIE, vol. 8681, pp. 86810Q-1-86810Q-8 (2013).

Unpublished European Patent Application No. 14168067.8, filed May 13, 2014.

Azimuth—Wikipedia, http://en.wikipedia.org/wiki/Azimuth, 6 pages (downloaded Dec. 15, 2014).

(Continued)

*Primary Examiner* — David J Makiya
*Assistant Examiner* — Soorena Kefayati
(74) *Attorney, Agent, or Firm* — Pillsbury Winthrop Shaw Pittman LLP

(57) ABSTRACT

A pattern is applied to a substrate by a lithographic apparatus as part of a lithographic manufacturing system. Structures are produced with feature sizes less than 10 nm. A target includes one or more gratings with a direction of periodicity. A detector captures one or more diffraction spectra, to implement small angle X-ray scattering metrology. One or more properties, such as linewidth (CD), are calculated from the captured spectra for example by reconstruction. The irradiation direction defines a non-zero polar angle relative to a direction normal to the substrate and defines a non-zero azimuthal angle relative to the direction of periodicity, when projected onto a plane of the substrate. By selecting a suitable azimuthal angle, the diffraction efficiency of the target can be enhanced by a large factor. This allows measurement time to be reduced significantly compared with known techniques.

20 Claims, 8 Drawing Sheets

(58) Field of Classification Search
CPC ............. G01N 23/205; G01N 23/2055; G01N 2223/054; G01N 2223/056; G01N 2223/0566; G01N 2223/611; G01N 2223/6116; G01N 2223/633

See application file for complete search history.

(56) References Cited

U.S. PATENT DOCUMENTS

| | | | |
|---|---|---|---|
| 6,921,916 B2* | 7/2005 | Adel | G03F 7/70633 257/48 |
| 7,481,579 B2* | 1/2009 | Yokhin | G03F 7/70633 378/205 |
| 7,483,513 B2 | 1/2009 | Mazor et al. | |
| 7,791,732 B2* | 9/2010 | Den Boef | G03F 7/70341 356/456 |
| 7,920,676 B2 | 4/2011 | Yun et al. | |
| 8,411,287 B2 | 4/2013 | Smilde et al. | |
| 8,563,229 B2* | 10/2013 | Tran | H01L 21/0274 430/323 |
| 9,005,875 B2* | 4/2015 | Bristol | G03F 7/38 430/296 |
| 9,081,303 B2 | 7/2015 | Cramer et al. | |
| 9,115,987 B2* | 8/2015 | Liu | G01B 11/245 |
| 9,134,256 B2 | 9/2015 | Smilde et al. | |
| 9,140,998 B2 | 9/2015 | Smilde et al. | |
| 9,255,877 B2* | 2/2016 | Veldman | G01N 21/211 |
| 9,255,996 B2* | 2/2016 | Sugiyama | G01N 23/04 |
| 9,305,346 B2* | 4/2016 | Yu | G06T 7/001 |
| 2007/0224518 A1 | 9/2007 | Yokhin et al. | |
| 2008/0273662 A1* | 11/2008 | Yun | G01N 23/201 378/74 |
| 2011/0027704 A1 | 2/2011 | Cramer et al. | |
| 2011/0043791 A1 | 2/2011 | Smilde et al. | |
| 2011/0135062 A1* | 6/2011 | Ishibashi | G01B 15/04 378/89 |
| 2011/0235029 A1 | 9/2011 | Kaneko et al. | |
| 2012/0013881 A1* | 1/2012 | Den Boef | G03B 27/52 355/67 |
| 2012/0044470 A1 | 2/2012 | Smilde et al. | |
| 2012/0123581 A1* | 5/2012 | Smilde | G03F 7/70483 356/445 |
| 2012/0206703 A1* | 8/2012 | Bhattacharyya | G03F 7/705 355/67 |
| 2013/0258310 A1 | 10/2013 | Smilde et al. | |
| 2013/0271740 A1 | 10/2013 | Quintanilha | |
| 2013/0304424 A1* | 11/2013 | Bakeman | G03F 7/70625 702/189 |
| 2015/0110249 A1* | 4/2015 | Bakeman | G01N 23/201 378/87 |
| 2015/0117610 A1* | 4/2015 | Veldman | G03F 7/70633 378/71 |
| 2015/0176985 A1 | 6/2015 | Shchegrov et al. | |
| 2015/0204802 A1 | 7/2015 | Pois et al. | |
| 2015/0331336 A1 | 11/2015 | Quintanilha et al. | |
| 2015/0369759 A1 | 12/2015 | Mazor et al. | |

FOREIGN PATENT DOCUMENTS

| | | |
|---|---|---|
| WO | 2009/106279 | 9/2009 |
| WO | 2013/178422 | 12/2013 |

OTHER PUBLICATIONS

Synchrotron light source—Wikipedia, http://en.wikipedia.org/wiki/Synchrotron_light_source, 6 pages (downloaded Jan. 13, 2015).

Harland G. Tompkins et al., "Spectroscopic Ellipsometry and Reflectometry: A User's Perspective," http://photonicssociety.org/newsletters/oct00/spectro.htm, 5 pages (downloaded Dec. 15, 2014).

Rigaku, "Semiconductors | Rigaku—X-ray analytical instrumentation," http://www.rigaku.com/industry/semiconductors, 1 page (downloaded Jan. 13, 2015).

Rigaku, "Semiconductor metrology products | Rigaku—X-ray analytical instrumentation," http://www.rigaku.com/products/semi, 1 page (downloaded Jan. 13, 2015).

Rigaku, "Ultra high-intensity microfocus rotating anode X-ray generator | Rigaku—X-ray analytical instrumentation," http://www.rigaku.com/products/protein/fre?language=en, 3 pages (downloaded Jan. 13, 2015).

Rigaku, "Process XRR, XRF, and XRD metrology FAB tool | Rigaku—X-ray analytical instrumentation," http://www.rigaku.com/products/semi/mfm310, 1 page (downloaded Jan. 13, 2015).

Oxford Instruments, Technical Datasheet, "90kv Microfocus X-ray Source: UltraBright 96000 Series," 4 pages (Downloaded Jan. 13, 2015).

Oxford Instruments, "UltraBright 96000 Series Microfocus X-ray Source—Oxford Instruments," http://www.oxford-instruments.com/products/x-ray-tubes-and-integrated-sources, 2 pages (downloaded Jan. 13, 2015).

J. Wiesmann et al., "High-Brilliance Home-Lab X-Ray Sources: Status and Future," Incoatec Innovative Coating Technologies GmbH, 1 page (Downloaded Jan. 13, 2015).

Taiwan Office Action dated Dec. 23, 2016 in corresponding Taiwan Patent Application No. 105102097.

Ronald L. Jones et al., "Sub-nanometer Wavelength Metrology of Lithographically Prepared Structures: A Comparison of Neutron and X-ray Scattering," Proc. of SPIE, vol. 5038, pp. 191-199 (2003).

Ronald L. Jones et al., "Pattern fidelity in nanoimprinted films using critical dimension small angle x-ray scattering," J. Microlith., Microfab., Microsyst., vol. 5, No. 1, pp. 013001-1-013001-7 (Jan.-Mar. 2006).

Ronald L. Jones et al., "3-Dimensional Lineshape Metrology Using Small Angle X-ray Scattering," AIP Conference Proceedings, vol. 683. New York: American Institute of Physics, pp. 434-438 (2003).

Ronald L. Jones et al., "Small angle x-ray scattering for sub-100 nm pattern characterization," Appl. Phys. Lett., vol. 83, No. 19, pp. 4059-4061 (Nov. 10, 2003).

E. Popov et al., "Conical Diffraction Mounting Generalization of a Rigorous Differential Method," J. Optics (Paris), vol. 17, No. 4, pp. 175-180 (1986).

Hideaki Abe et al., "Verification metrology system by using inline reference metrology," J. Micro/Nanolith., MEMS MOEMS, vol. 13, No. 4, pp. 041405-1-041405-5 (Oct.-Dec. 2014).

* cited by examiner

METROLOGY METHOD, METROLOGY APPARATUS AND DEVICE MANUFACTURING METHOD

This application claims priority to European patent application no. 15153825.3, filed Feb. 4, 2015, which is incorporated herein in its entirety by reference.

FIELD

The present description relates to methods and apparatus for metrology usable, for example, in the manufacture of devices by lithographic techniques and to methods of manufacturing devices using lithographic techniques. Methods of measuring critical dimension (line width) are described, as a particular application of such metrology.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer).

In lithographic processes, it is desirable frequently to make measurements of the structures created, e.g., for process control and verification. Various tools for making such measurements are known, including scanning electron microscopes (SEM), which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis. Compared with SEM techniques, optical scatterometers can be used with much higher throughput, on a large proportion or even all of the product units.

SUMMARY

The targets used by conventional scatterometers are relatively large, e.g., 40 μm by 40 μm, gratings and the measurement beam generates a spot that is smaller than the grating (i.e., the grating is underfilled). In order to reduce the size of the targets, e.g., to 10 μm by 10 μm or less, e.g., so they can be positioned in amongst product features, rather than in the scribe lane, so-called "small target" metrology has been proposed, in which the grating is made smaller than the measurement spot (i.e., the grating is overfilled). These targets can be smaller than the illumination spot and may be surrounded by product structures on a substrate. Typically small targets are used for measurement of overlay and other performance parameters that can be derived from measurements of asymmetry in the grating structure. By placing the target in among the product features ("in-die target"), it is hoped to increase accuracy of measurement. The improved accuracy is expected for example because the in-die target is affected by process variations in a more similar way to the product features, and less interpolation may be needed to determine the effect of a process variation at the actual feature site. These optical measurements of overlay targets have been very successful in improving overlay performance in mass production.

As technology develops, however, performance specifications become ever tighter. Moreover, small target techniques have not been developed for measurement of other parameters such as line width or critical dimension (CD). A further limitation of current methods is that they are made with optical wavelengths, much greater than the typical dimensions of real product features. A particular parameter of interest is linewidth (CD), and a suitable small-target method for CD measurement has not yet been devised.

As an alternative to optical metrology methods, it has also been considered to use X-rays to measure overlay in a semiconductor device. One technique is known as transmissive small angle X-ray scattering or T-SAXS. A T-SAXS apparatus applied to measurement of overlay is disclosed in United States patent application publication no. US 2007-0224518, the entire contents of which is incorporated herein by reference. Profile (CD) measurements using T-SAXS are discussed by Lemaillet et al in "Intercomparison between optical and X-ray scatterometry measurements of FinFET structures", Proc. of SPIE, 2013, 8681. T-SAXS uses X-rays of wavelength less than 1 nm, and so targets for T-SAXS can be made of product-like features. Unfortunately, T-SAXS signals tend to be very weak, especially when the target size is small. Therefore the measurements tend to be too time-consuming for use in high-volume manufacturing. While a T-SAXS apparatus can be used to measure targets small enough to be considered for placement among the product features, unfortunately, the small target size requires a small spot size and consequently even longer measurement times.

Accordingly, it desired to enable the use of T-SAXS in small target metrology to measure one or more parameters, for example, at locations within product areas on a semiconductor substrate, while improving the speed with which such measurements can be performed.

In aspect, there is provided a method of measuring a property of a structure formed by a lithographic process, the method comprising:

irradiating a periodic structure with x-radiation along an irradiation direction, the periodic structure having been formed by the lithographic process on a substrate and having a periodicity in a first direction, detecting x-radiation scattered by the periodic structure after transmission through the substrate, and processing signals representing the detected scattered radiation to determine a property of the periodic structure, wherein the irradiation direction defines a non-zero polar angle relative to a direction normal to the substrate and defines a non-zero azimuthal angle relative to the first direction, when projected onto a plane of the substrate.

In other words, the method is performed such that a direction of irradiation lies outside a plane defined by the first direction and a direction normal to the substrate so as to define a non-zero azimuthal angle relative to the first direction, when viewed from the substrate. In the literature, T-SAXS measurements for CD metrology have been performed with zero azimuthal angle. The method disclosed herein may be performed using an azimuthal angle greater than 15, 30, 45 degrees, even up to 80 degrees if desired. The non-zero azimuthal angle can be achieved by using what is referred to in other measurement techniques as a conical mount.

By using a conical mount in performing T-SAXS for CD metrology, the azimuthal angle is selected so that a diffraction efficiency of the periodic structure in one or more non-zero diffraction orders is greater than would be the case for an irradiation direction of zero azimuthal angle. Depending on the target structure and materials, signals (diffraction orders) important for the measurement of its structure may be very weak at one azimuthal angle, but stronger at another.

In an embodiment, for example, the azimuthal angle may be selected so that a diffraction efficiency of the periodic structure in a first order of diffraction is more than two times, optionally more than five times or more than ten times the diffraction efficiency for zero azimuthal angle. Alternatively, or in addition, the azimuthal angle may be selected so that a diffraction efficiency of the periodic structure in a plurality of non-zero diffraction orders is greater than would be the case for an irradiation direction of zero azimuthal angle.

In one embodiment, the irradiating and detecting are repeated using different polar angles and wherein in the processing, signals representing the scattered radiation detected using a plurality of different polar angles are used to determine the property of the periodic structure.

In an aspect, there is provided an x-ray metrology apparatus for use in measuring performance of a lithographic process, the apparatus comprising:

an irradiation system for generating a beam of x-radiation;

a substrate support operable with the irradiation system for irradiating a periodic structure formed on the substrate with x-radiation along an irradiation direction; and a detection system for detecting x-radiation scattered by the periodic structure after transmission through the substrate, and wherein the substrate support is adjustable in at least two angular dimensions relative to the irradiation direction, so that the irradiation direction can be selected to have a non-zero polar angle relative to a direction normal to the substrate and can simultaneously be selected to define a non-zero azimuthal angle relative to the first direction, when projected onto a plane of the substrate.

In a particular implementation, the substrate support is adapted to receive semiconductor wafers (for example 300 mm wafers) from an automated substrate handler.

In an aspect, there is provided a device manufacturing method comprising:

transferring a pattern from a patterning device onto a substrate using a lithographic process, the pattern defining at least one periodic structure;

measuring one or more properties of the periodic structure to determine a value for one or more parameters of the lithographic process; and applying a correction in subsequent operations of the lithographic process in accordance with the measured property, wherein measuring the properties of the periodic structure includes measuring a property by a method as described herein.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example, with reference to the accompanying drawings in which.

DETAILED DESCRIPTION

Before describing embodiments in detail, it is instructive to present an example environment in which embodiments described herein may be implemented.

Figure 1:
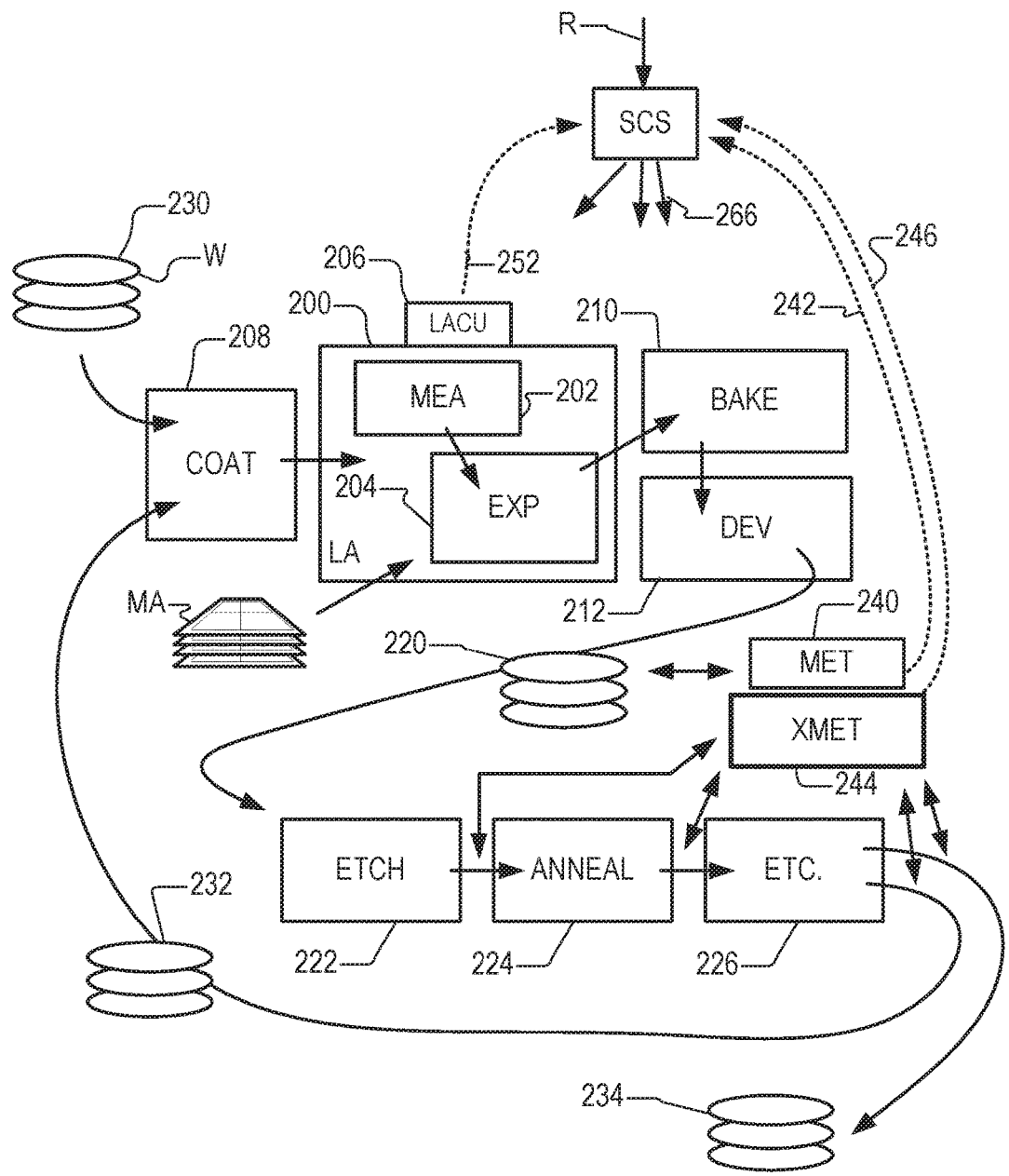
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and patterning devices MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and/or measuring the position of alignment marks on the substrate using an alignment sensor. The alignment marks are arranged nominally in a regular grid pattern. However, due to inaccuracies in creating the marks and also due to deformations of the substrate that occur throughout its processing, the marks may deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled 266 by a supervisory control system SCS, which also controls 266 the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate and also receives, for example, information 252 from LACU.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Each generation of lithographic manufacturing technology (commonly referred to as a technology "node") has tighter specifications for performance parameters such as CD. One of the main challenges in metrology is the metrology target size which is also required to be smaller than the targets customarily used with metrology apparatus 240. For example, a present goal is to use targets with a size of 5 μm ×5 μm or smaller. These small sizes would permit wider use of so-called "in-die" or "on product" metrology. The only metrology technique used in-die for CD metrology is currently electron microscopy (CD-SEM). This known technique shows limitations for future nodes and only provides anyway very limited geometrical information of the structure.

Transmissive small angle x-ray scatterometry (T-SAXS) has been investigated recently as a CD-metrology method solution for future technological nodes. T-SAXS offers benefits of high sensitivity, being robust against process variations and being selective for a parameter of interest. For this purpose, the manufacturing system illustrated in FIG. 1 includes one or more x-ray metrology apparatuses 244 in addition to the optical scatterometer 240. This x-ray metrology apparatus provides additional metrology results 246 which can be used by supervisory control system SCS to achieve further control of quality and improvement in performance of the lithographic manufacturing system as a whole. Whereas an optical scatterometer will often be used to inspect structures within the resist material treated within the litho cell, an x-ray metrology apparatus will more often be applied to measure structures after they have been formed in harder material. For example, substrates may be inspected using x-ray metrology apparatus 244 after they have been processed by the etching apparatus 222, annealing apparatus 224 and/or other apparatus 226.

The limited power of compact x-ray sources means that known T-SAXS techniques suffer from a very low throughput. Typically it takes minutes for one measurement. With a move to smaller targets, the problem of long measurement time would become even worse. Higher power x-ray sources exist, based on synchrotron technology. However, synchrotron sources are large and costly, and confined to a few scientific research facilities. The present disclosure aims to improve the throughput of T-SAXS metrology using existing x-ray sources. In particular, some enhanced methods of T-SAXS metrology are implemented using x-ray metrology apparatus 244, which offer improved performance over known techniques.

T-SAXS Metrology Introduction

Figure 2:
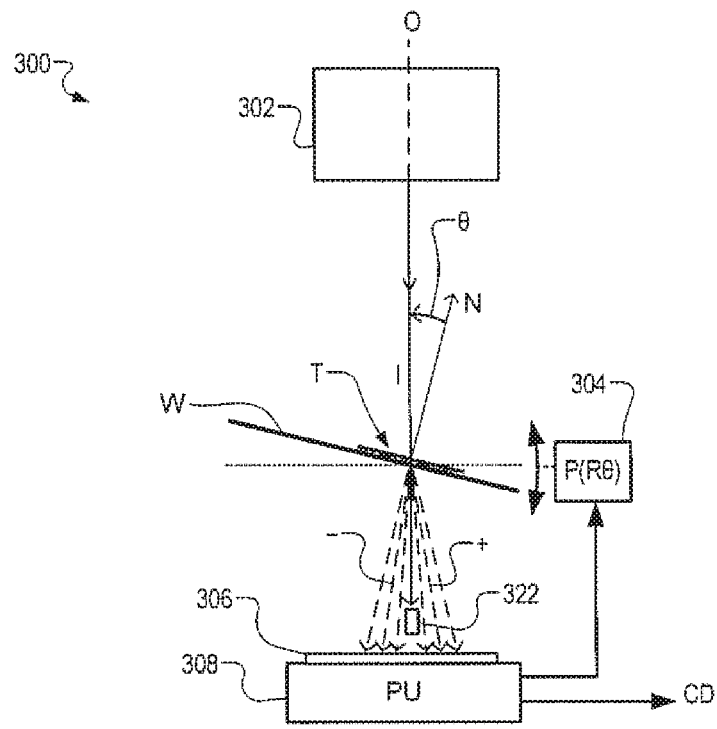
FIG. 2 depicts an X-ray metrology apparatus and optical metrology apparatus measuring a grating target on a substrate.

Before describing the enhanced methods, the technique of small angle x-ray scatterometry (T-SAXS) is introduced. FIG. 2 illustrates a schematic x-ray metrology apparatus 300 for use in measuring one or more parameters of a substrate processed in the manufacturing system of FIG. 1. X-ray metrology apparatus 300 measures one or more properties of a metrology target T formed on substrate W. An x-ray optical axis is represented simply by a dotted line O. A illumination system 302 provides a beam of X-ray radiation represented by ray I which forms a focused irradiation spot on target T. Substrate W is mounted on a movable support having a positioning system 304 such that an angle of incidence of ray I can be adjusted. In particular, known methods vary a polar angle θ, defined in this illustration as an angle between the direction of incidence of incident ray I and a direction N normal to the substrate. Other positioning systems may be provided to move the target into position at the irradiation spot. The radiation passes through target T and through substrate W and is scattered into a plurality of scattered rays before it impinges on detector 306. Detector 306 comprises for example a position-sensitive X-ray detector, typically an array of detector elements. The array may be a linear array, but by providing a 2-dimensional array of elements (pixels), diffraction patterns in both X and Y directions can be captured simultaneously. Detector 306 may be for example a CCD (charge coupled device) image sensor. A processor 308 receives signals from the detector and these are used in the processor to calculate a measurement of property of the target, for example CD or overlay.

Figure 3:
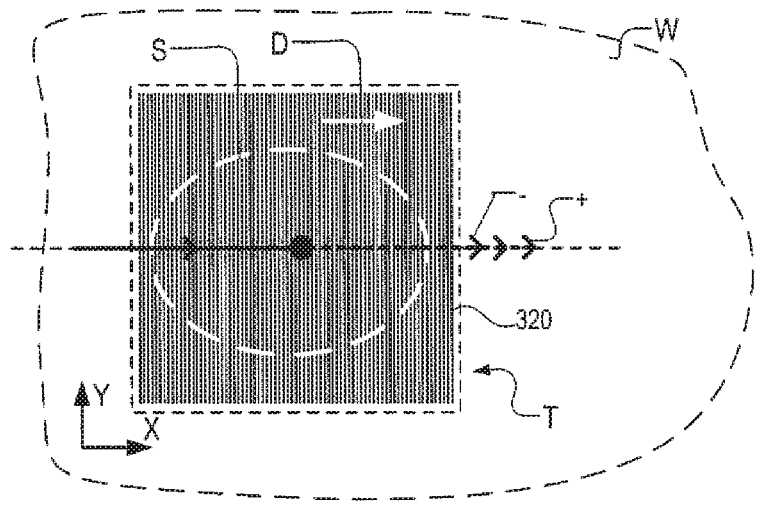
FIG. 3 shows in plan view the orientation of incident and scattered rays in the apparatus of FIG. 2 when measuring properties of a grating target.

Referring now to FIG. 3, a schematic plan view of the substrate W with target T, viewed along the direction N normal to the substrate, is depicted. Target T is a periodic structure having a direction of periodicity indicated by arrow D. In this example, where axes X and Y are defined in a coordinate system of the substrate W, the periodic structure comprises a number of lines 320 extending in the Y direction, so that the direction of periodicity D is aligned with the Y axis. The skilled person will appreciate that other targets may have grating lines arranged with a different orientation. In particular, a set of targets may be provided with both X and Y periodicity, two-dimensional gratings can also be provided, having two equal directions of periodicity, for example two directions orthogonal to one another. While a single representative beam is illustrated passing through the target, an oval S represents an example extent of the radiation spot. Incident rays will fall throughout the spot area. Conventionally the incident radiation is collimated within the illumination system 302 so that the incident rays are parallel to the extent possible. Spot S here is represented as an oval shape, on the assumption that the incident beam has a circular cross-section. The spot becomes elongated because of the non-zero angle of incidence θ.

Referring back to FIGS. 2 and 3 together, it will be appreciated that some of the radiation transmitted through target T and substrate W is diffracted to different angles and detected at different positions on detector 306. As in an optical scatterometer, a periodic grating will in particular give rise to positive and negative diffraction orders, labeled schematically with '+' and '−' signs in the diagram. The positions and intensities of the different orders are recorded by detector 306 and may be referred to as a diffraction spectrum. The form of this diffraction spectrum (for example the relative intensities of diffraction orders within the diffraction spectrum) can be used to calculate the one or more properties of the target structure. The angles are exaggerated in this schematic diagram, and very small angles may be seen in practice. The detector may be placed tens of centimeters or even meters from the substrate, in order for any spread of the orders to be resolved. However, the spread increases as the period of the structure shrinks, which makes x-ray metrology attractive for the future nodes. In practice, the intensity of the diffracted beams is also very weak in comparison with the incident straight through (zero order) beam. A stop device 322 is generally provided to block the zero order beam so that the weaker signals are not overwhelmed at the detector.

The x-radiation may for example have a photon energy greater than 13 keV. It may have a wavelength less than 1 nm, or less than 0.1 nm in practice. The photon energy (hence wavelength) depends typically on the choice of anode material in a compact x-ray source. A wavelength of 0.073 nm is obtained for example from the k-alpha line of a Mo anode, while other anode materials such as Sn are used.

Dimensions of the lines and spaces will depend on the target design, but the period of the structure may be for example less than 20 nm, even less than 10 nm and down to 5 nm. The lines 320 of the grating structure may be of the same dimension and pitch as product features in a product area of the substrate. The lines of the grating structure may in fact be the lines of a product structure, rather than a target structure formed within a dedicated target area, solely for the purposes of metrology. Such small features may be formed for example in an EUV lithography process, by imprint lithography or by direct-write methods. Such small features may also be formed using present-day DUV lithography, by a so-called double-patterning process (generally multiple-patterning). Techniques in this category include pitch-doubling, for example by litho-etch-litho-etch (LELE) and self-aligned dual-damascene in back end-of the line (BEOL) layers. For the purposes of explanation, it will be assumed in the following examples that CD is the parameter of interest. However, where there are two gratings formed on top of one another, another parameter of interest maybe overlay. This can be measured based on asymmetry in the T-SAXS diffraction orders, as described separately below.

In the multiple-patterning process, structures are formed in one layer of the product not in one patterning operation but in two or more patterning steps. Thus, for example, a first population of structures may be interleaved with a second population of structures, and the populations are formed in different steps, so as to achieve a higher resolution than one step alone can produce. While the placement of the populations should be identical and perfect in relation to other features on the substrate, of course every real pattern exhibits a certain positional offset. Any unintentional positional offset between the populations can be regarded as a form of overlay, and can be measured by analogous techniques to those disclosed herein. Additionally, overlay against features in an underlying or overlying layer can be different for each population when multiple populations of features are formed in a single layer, and overlay for each of these populations can be measured separately if desired.

In the applications of T-SAXS to metrology on target gratings in semiconductor manufacturing, multiple diffraction spectra are captured using detector 306, while setting the polar angle of incidence θ to various different values. Using the detected spectra and a mathematical model of the target structure, reconstruction calculations can be performed to arrive at measurement of CD and/or other parameters of interest. An example reconstruction method will be illustrated further below.

T-SAXS Metrology with Increased Throughput

As mentioned already, a problem with known T-SAXS methods is the low throughput. This arises because the available intensity of a collimated, focused beam of x-radiation is very limited. Even starting from a reasonable power or source, the nature of the optical system required to produce the collimated beam and focus it into a spot of, say, 20 µm diameter involves a loss most of the source radiation. To form a spot size of 5 µm or smaller can be envisaged with improved optics, but the loss of power will be proportionately greater. The interesting orders of the diffraction spectrum are in turn several orders of magnitude weaker than the incident radiation. For practical purposes, in industrial applications, choices for the source of x-radiation in illumination system 302 are limited to being one of the available compact ("table-top") sources. These are generally of the microfocus rotating anode type, or liquid jet type. From these compact sources, the power in a diffraction spectrum is so low that the detector must operate for several minutes to capture just one diffraction spectrum. Considering that several spectra at different incidence angles may be wanted to allow an accurate measurement of the target, the measurement time becomes impractically long.

Compact synchrotron sources may yield more useful power levels, but these are not yet commercially available. For the time being, the present disclosure addresses the problem of maximizing the measurement throughput using the sources available.

Figure 4:
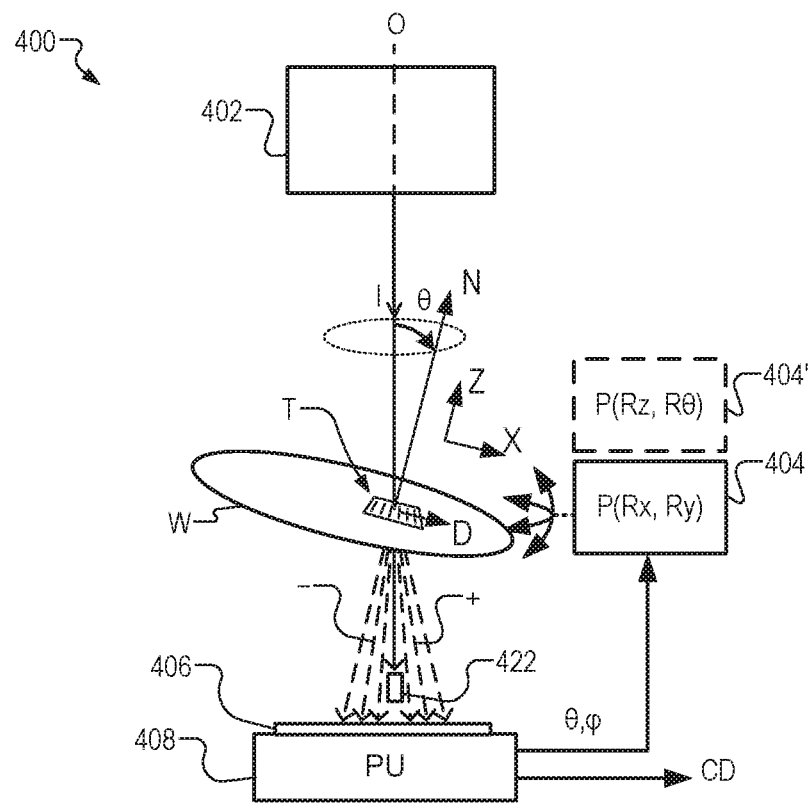
FIG. 4 depicts an embodiment of a modified X-ray metrology apparatus and optical metrology apparatus measuring a grating target on a substrate.

FIG. 4 illustrates a schematic modified x-ray metrology apparatus in which the interesting diffraction orders can be scattered with higher diffraction efficiency than in the apparatus of FIG. 2. Accordingly, without requiring a higher powered incident beam, stronger signals can be recorded by the detector, allowing shorter measurement times and higher throughput. Components of the FIG. 4 apparatus should be considered to be the same as those of the FIG. 2 apparatus, unless mentioned otherwise. Reference signs beginning '4' are used to reference similar features as the reference signs beginning '3' in the apparatus of FIG. 2. Thus the modified apparatus includes an illumination system 402, substrate positioning system 404, detector 406 and processor 408. Compared with the apparatus of FIG. 2, however, positioning system 404 is operable so that the angle of incidence of incident ray I can be varied not only in a polar angle θ, but also in an azimuthal angle, here labeled φ.

Figure 5:
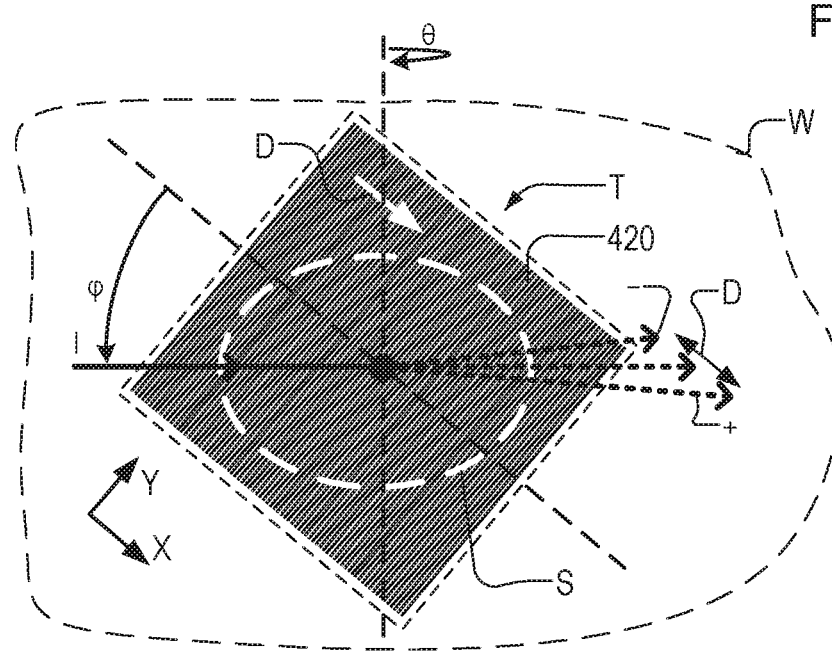
FIG. 5 shows in plan view the orientation of incident and scattered rays in the apparatus of FIG. 3 when measuring properties of a grating target.

To illustrate this difference, FIG. 5 shows the target T in plan view, looking in a direction normal to substrate W, the same as in FIG. 3. Again, target T is assumed to comprise a one-dimensional grating with a plurality of lines 420 and with a direction of periodicity D parallel to the X axis of the substrate. Again, the substrate and target can be tilted to vary the angle of incidence. However, a non-zero azimuthal angle of incidence φ is allowed. That is to say, when the direction of incidence is projected onto the plane of the substrate, the azimuthal angle φ between the incident ray and the direction of periodicity D is non-zero, and may be very substantial. By contrast, while the known technique varies the polar angle of incidence θ, the direction of incidence is always aligned with the direction of periodicity when projected onto the plane of the target (zero azimuthal angle). The diffraction efficiency of interesting diffraction orders can be increased substantially when non-zero azimuthal angles are used. An example of this effect will be illustrated below.

As illustrated at 404 and 404' in FIG. 4, different arrangements of positioning system can be used to effect the non-zero azimuthal angle. Reference 404 indicates a positioning subsystem with actuators for rotation about the X and Y axes of the substrate. For a desired combination of polar angle a and azimuthal angle φ, appropriate command values Rx and Ry are calculated to cause tilting of the substrate in two dimensions to achieve the desired angles. In another implementation represented at 404', actuators are provided for rotation of the substrate about its z axis, and for polar angle θ. As will be appreciated from FIG. 5, rotation Rz corresponds directly to a desired azimuthal angle φ, and command values in this case can be generated more directly from the desired measurement angles.

In other areas of metrology, the type of mounting required to vary both the polar angle and the azimuthal angle is known as a "conical mount", and that term can be adopted in this T-SAXS apparatus also. In general, any form of command and any form of actuating mechanism can be used, provided it is suitable to achieve a known non-zero azimuthal angle of incidence. It will also be understood that the relative orientation of the direction of incidence, and the target is what matters (and of course the correct positioning of the target relative to the radiation spot S). One or more additional actuators, not shown, may be provided for bringing each target T into a position where the focused spot S of radiation is located. (Looking at it another way, to bring the spot to the position where the target is located.) In a practical application, there may be a succession of individual targets or target locations to be measured on a single substrate, and a succession of substrates too. It is immaterial, in principle, whether the substrate and target are moved and reoriented while the illumination system and detector stay still, or whether the substrate stays still while the illumination system and detector are moved, or whether different components of the relative movement are achieved by a combination of these techniques. The present disclosure encompasses all these variants.

Figure 6:
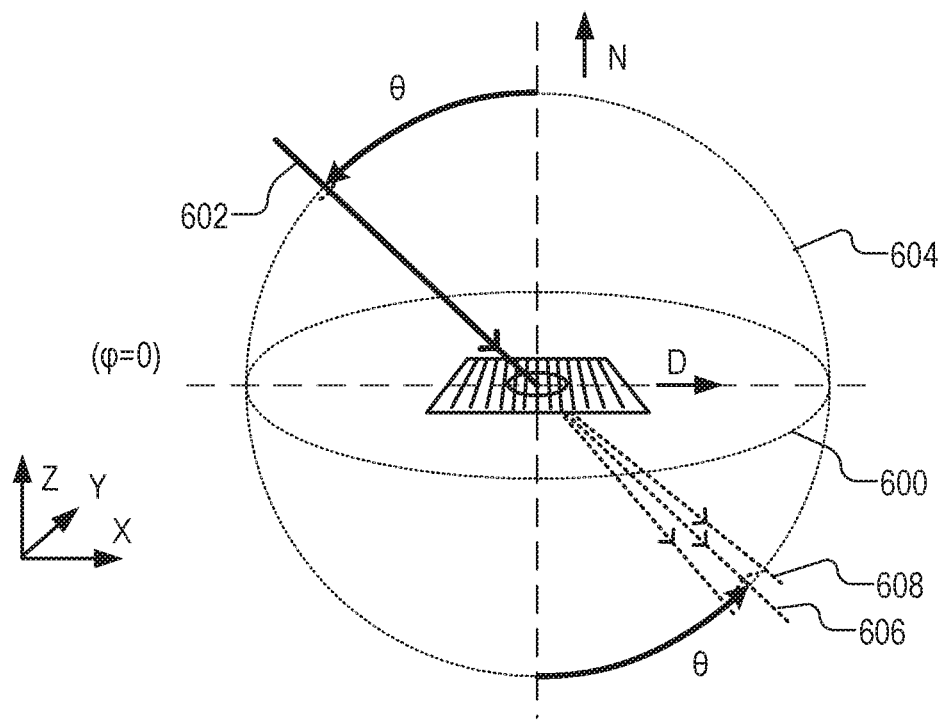
FIG. 6 illustrates the geometry of incident and scattered rays in relation to a grating target with variation of polar angle $\theta$ in the apparatus of FIGS. 2 and 3.
Figure 7:
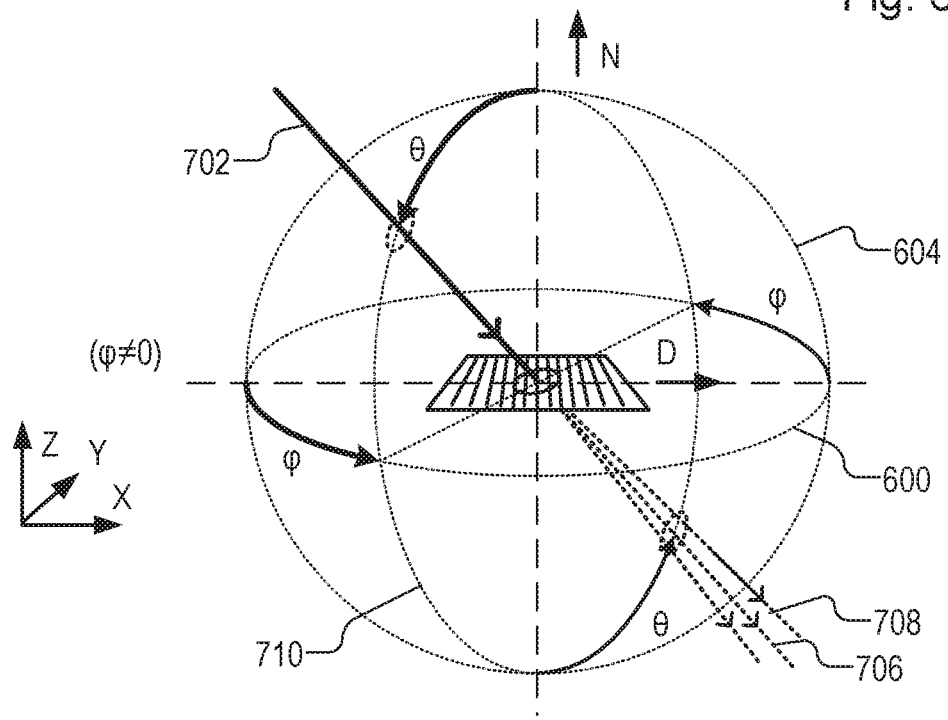
FIG. 7 illustrates the geometry of incident and scattered rays with variation of polar angle $\theta$ and azimuthal angle $\varphi$ in the apparatus of FIGS. 4 and 5.

FIGS. 6 and 7 together show the contrast between the geometry of the x-ray metrology method according to the method of FIGS. 2 and 3 and that of FIGS. 4 and 5. In each Figure, the target is represented schematically as comprising a one-dimensional grating at the origin of a spherical reference frame. Axes X, Y and Z are defined relative to the target. The drawing is not a true perspective drawing, but a schematic illustration only. The X-Y plane is the plane of the target and substrate, and for clarity is shown tilted toward the viewer, represented by an oblique view of circle 600. The direction of periodicity D of the target structure is aligned with the X axis. The Z direction defines the direction N normal to the substrate. In FIG. 6, one of the incident rays is labeled 602 and has a polar angle of incidence θ. There is no non-zero azimuthal angle, so that the incident ray 602 (and all incident rays forming the radiation spot S) lie substantially in a plane parallel to the X-Z plane, that is a plane defined the directions D and N and represented by circle 604. The transmitted ray 606 that is not scattered by the periodic structure of the target emerges in the same direction as the incident ray 602, while diffraction by the period structure leads to divergent rays 608 of different polar angles and intensities.

FIG. 7 shows the geometry of the enhanced method in the same reference frame as FIG. 6. It can be seen that the incident ray 702 (an all rays forming the spot S) is no longer parallel to the plane represented by circle 604. Rather, the direction of the incident ray (direction of irradiation) is such as to have a non-zero azimuthal angle φ. For the purposes of this disclosure, the azimuthal angle is defined as the angle between the incident ray direction and the direction of periodicity of the periodic structure when the incident ray direction is projected onto the plane of the substrate, is no longer zero. That is to say, the direction of irradiation lies outside a plane defined by the direction of periodicity D and the direction N normal to the substrate. Rather, the incident ray travels in a plane oblique to the direction of periodicity D. The oblique plane is represented by a circle 710 that is orthogonal to the plane of the substrate but oblique to the direction of periodicity and the X-Z plane. It will be understood that, while the choice of labels of planes and axes is arbitrary, the polar angle and azimuthal angle are defined with reference to physical properties of the periodic structure of the target.

Naturally, the transmitted ray 706 that is not scattered by the target emerges with the same polar and azimuthal angle as the incident ray. The diffracted radiation 708 emerges with a range of slightly modified polar and azimuthal angles. As illustrated in FIG. 5, the angular spread of the diffraction orders is aligned with the direction of periodicity D, not the direction of incidence. Accordingly, where detector 406 is a two-dimensional image detector, it should be anticipated that the different diffraction orders will be separated in a direction rotated according to the azimuthal angle. Alternatively, the detector could be arranged to have a constant orientation relative to the direction of periodicity of the target. In practice, a detector comprising a 2-D array of pixels will be favored. That way, any orientation of pattern can be captured without worrying about the detector orientation, and patterns from 2-D grating targets (for example arrays of contact holes) can be measured.

As mentioned above, the use of non-zero azimuthal angles may allow enhanced diffraction efficiency using the conical mount of FIGS. 4, 5 and 7, compared with a known arrangement. This will in turn provide stronger signals at the detector 406 and a shorter measurement times. This diffraction efficiency benefit will be illustrated below with reference to FIG. 8. Another benefit of using a non-zero azimuthal angle can be seen already in FIG. 5, by comparison with FIG. 3. Notice that the spot S, which is elongated because of the oblique polar angle of incidence, is elongated in a direction defined by the azimuthal angle. Therefore the longest dimension of the spot is aligned with a diagonal direction of the target. Given that the majority of targets will be rectangular in shape, this diagonal elongation of the spot in fact allows a larger spot overall to be fitted within the target area. Consequently, for a given illumination intensity, a greater overall power of measurement radiation can be directed at the target and so the signal at detector 406 will be proportionately increased. This effect alone may allow a slight shortening in measurement time.

Figure 8A:
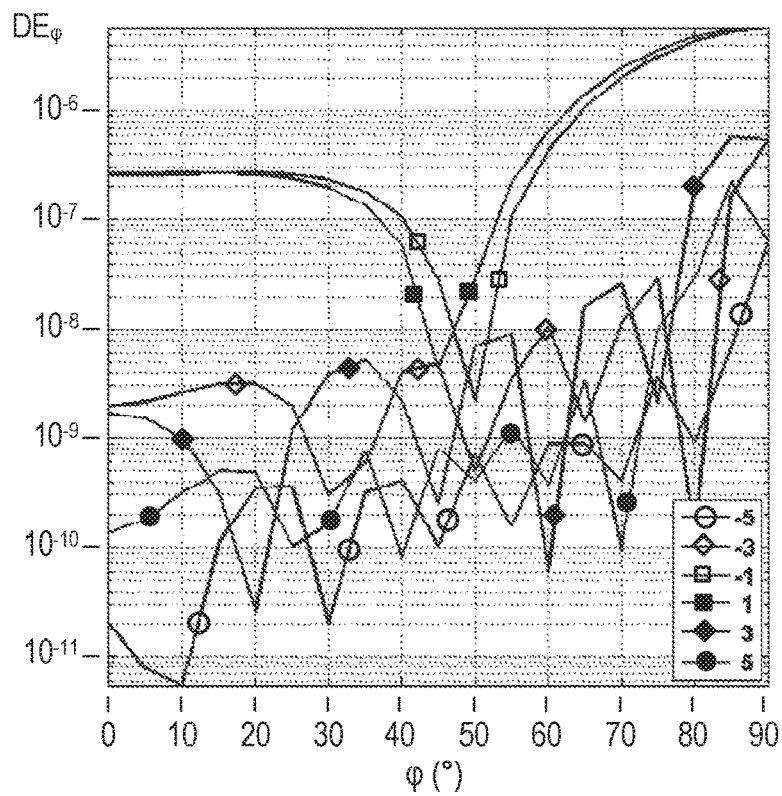
FIG. 8A illustrates, on a log scale, how diffraction efficiency of different diffraction orders varies as a function of azimuthal angle for an example target in the apparatus of FIGS. 4 and 5.

Referring to FIG. 8A, a plot of intensities simulated for a few non-zero diffraction orders for a commercially relevant target is presented. The target is a line profile grating formed in the course of manufacturing dual-gate finFET device. (A finFET is a type of field-effect transistor having a 3-D structure with a wrap-around gate.) The pitch of the grating is 9 nm and the wavelength $\lambda$ of the x-radiation is 0.073 nm. The vertical axis represents diffraction efficiency on a log scale. The diffraction efficiency DE is a measure of the fraction of the incident radiation power that emerges in the respective diffraction order. The horizontal axis represents the range of azimuthal angles $\varphi$ at which measurements have been made. The polar angle $\theta$ is constant in this experiment at 15 degrees. Separate traces are shown for plus and minus $1^{st}$, $3^{rd}$ and $5^{th}$ diffraction orders, which will be identified as peaks in the diffraction spectrum recorded by a detector 406. Different target profiles will give different relative strengths of these different orders. Comparing these relative strengths allows measurements of properties of the structure such as CD to be calculated.

Figure 8B:
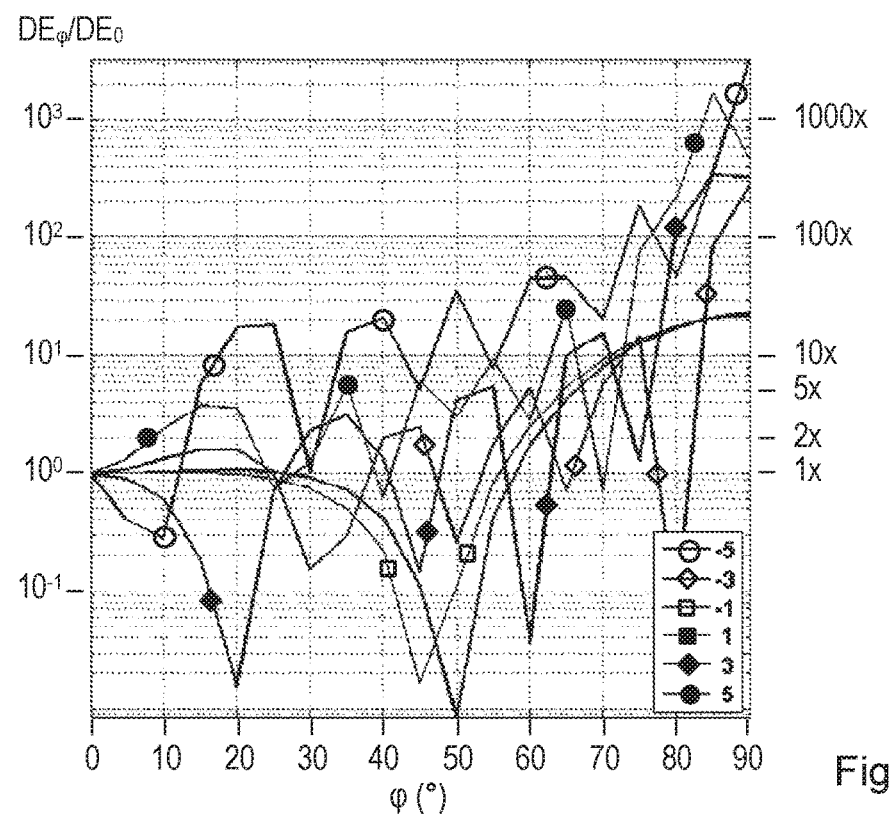
FIG. 8B illustrates how the diffraction of each diffraction order varies with azimuthal angle, relative to its value at zero azimuthal angle.

Note that the strongest diffraction efficiency is only about $10^{-6}$ and the weakest ranges down to $10^{-11}$. This emphasizes the weakness of the signals that are to be detected and compared, and illustrates the origin of the long measurement times. The zero order (straight through) radiation is not shown here, and would be off the scale if it were. On the other hand, it can be seen that the diffraction efficiency of each order also varies strongly, as the azimuthal angle varies from zero to 90 degrees. FIG. 8B shows the same diffraction efficiency values, but with each order normalized according to its value at zero azimuthal angle. The $3^{rd}$ and $5^{th}$ order signals in particular can increase by two or more orders of magnitude as the azimuthal angle increases. Even if it is noticed that the first order signals are weaker for azimuthal angles in the range 30 to 50 degrees than at zero degrees, it may also be noted that they are much stronger than the higher orders at zero degrees. Even when reduced, therefore, the effect is merely to equalize the various orders to more comparable strengths. While the example graphs illustrate orders up to $5^{th}$ order, there is no limit in principle on the number of orders that can be included. $7^{th}$, $9^{th}$ $11^{th}$ orders, for example, can be enhanced by proper selection of azimuthal angle and polar angle.

Each design of target, with its different structures and materials, will exhibit its own particular set of diffraction efficiencies, and its own set of variations in the way they vary with azimuthal angle (and polar angle). In the illustrated finFET example, the gain in intensity by using conical mounting can be quite significant in a real application. In this finFET case the average gain is 5-200. So, by choosing the proper azimuthal angle of incidence (and of course a polar angle of incidence different from zero), a significant increase of the diffraction efficiency can be obtained. This in turn will relax the huge constraint of the source brightness required by the method to be used in high volume manufacture.

Another technique that may be applied in the enhanced x-ray metrology method and apparatus is to use a convergent beam instead of a "perfectly" collimated incident beam. In x-ray optical systems, such as the illumination system 402 of the T-SAXS apparatus, a collimated beam is produced at the expense of discarding a lot of radiation generated by the source. Conventionally, one would seek to design the system with a maximally collimated beam. This is because the effect of divergence of the transmitted beam is to enlarge diffraction peaks which would normally blur the distinction between peaks and reduce the quality of the measurements. However for future technology nodes the angular separation of the diffraction peak increases. With suitable choice of wavelength this allows the use of a slightly convergent beam.

The flux at the sample is proportional roughly to the square of the convergence d. Using a synchrotron source, the divergence may be increased up to one or more millirad (1 millirad=0.057 degree) from the usual value of around 0.1 mrad. Accordingly, using a beam with convergence angle in the range above 0.5 mrad, for example greater than 1 or greater than 2 mrad may allow a power gain of 100-1000 compared with a normally collimated beam. Additionally, some slight convergence in the beam will allow optical design to focus the same power into a smaller illumination spot, and consequently allow smaller target design.

These measures can be used in combination with the conical mounting to obtained stronger diffraction signals to allow more rapid measurements in T-SAXS metrology on, for example, semiconductor products. Of course, the desire to increase throughput is always there, and advantage can be taken of more powerful compact x-ray sources, as and when they become available.

Typically X-rays with energy higher than 13 keV or higher than 15 keV will be used, having a very short wavelength of less than 0.1 nm. Compact sources are readily available with various energies. At these wavelengths, a silicon substrate is essentially transparent and it is possible to measure the scatter pattern of a target (for example the diffraction pattern of a grating) through the substrate. T-SAXS techniques are widely used for analyzing materials, and suitable T-SAXS apparatuses are commercially available, for example from Xenocs (Grenoble, France; www.xenocs.com) or Bruker AXS GmbH (Karlsruhe, Germany; www.bruker.com). A T-SAXS apparatus applied to measurement of overlay is disclosed in U.S. patent application publication no. US 2007-0224518, which is incorporated herein by reference in its entirety. The illumination system in that example comprises an X-ray source, and optical elements such as a monochromator and a collimator. The monochromator ensures a narrow range of wavelengths will be used, while the collimator ensures a narrow range of incidence angles to form the X-ray irradiation spot. The spot size may be tens of microns, for example between 20 and 200 µm in diameter. The spot size may be smaller.

U.S. patent application publication no. US 2015-0331336, which is incorporated herein in its entirety by reference, describes in detail the measurement of overlay using T-SAXS. The application further discloses a hybrid technique in which both optical scatterometry and x-ray metrology are used.

Application Example

Figure 9:
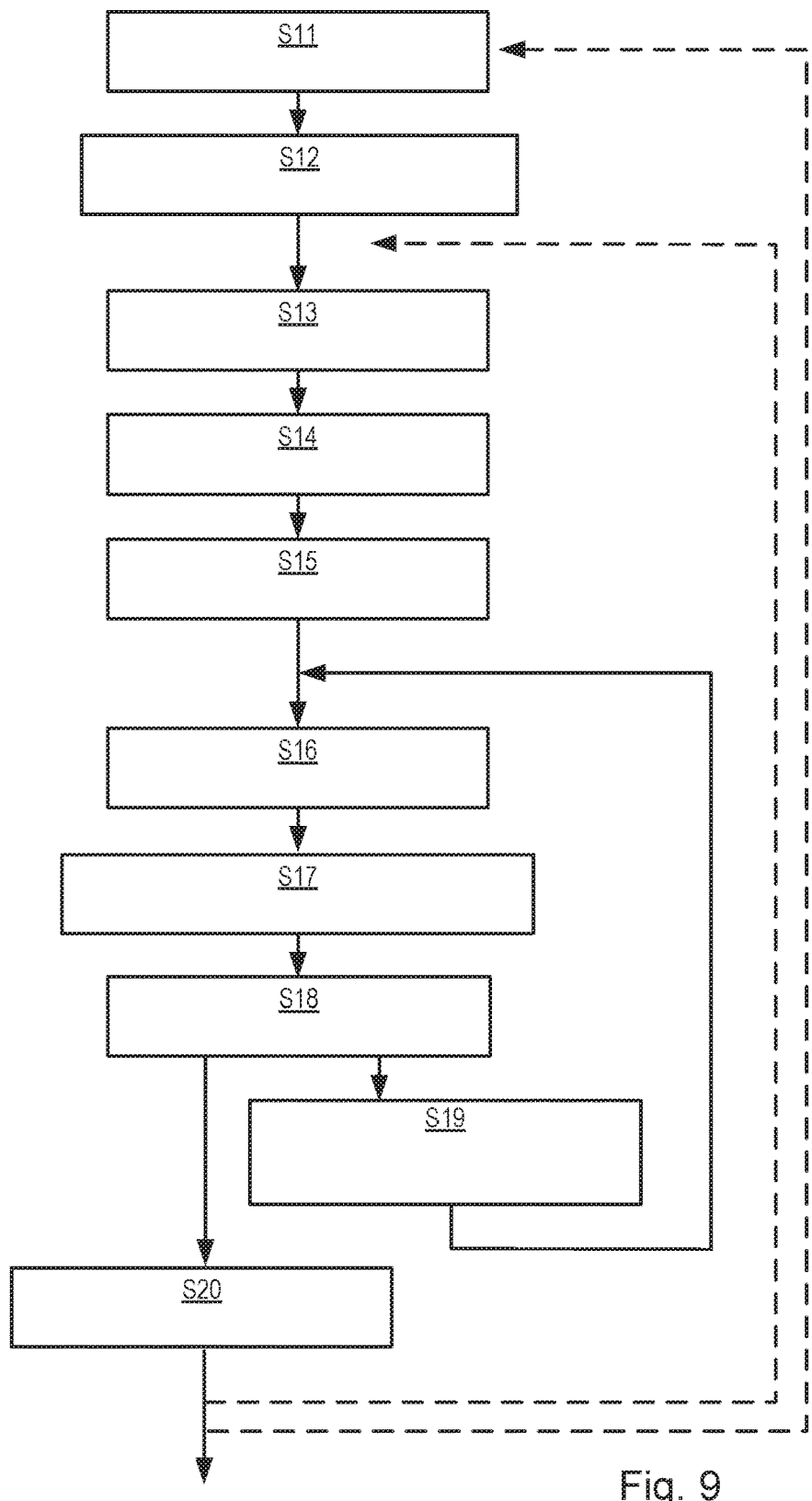
FIG. 9 is a flow chart illustrating an embodiment of a metrology method.

FIG. 9 is a flowchart of a method of measuring parameters of a target structure, using the enhanced x-ray metrology techniques disclosed herein. As described above, the target is on a substrate such as a semiconductor wafer. This target will often take the shape of a periodic series of lines in a grating or structures in a 2-D array. The purpose of the metrology techniques is to calculate measurements of one or more parameters of the shape. In a reconstruction technique, rigorous optical diffraction theories are used effectively to calculate what values of these parameters will result in a particular observed diffraction spectrum. In other words, target shape information is obtained for parameters such as CD (critical dimension) and overlay metrology. Overlay metrology is a measuring system in which the overlay of two targets is measured in order to determine whether two layers on a substrate are aligned or not. CD, or critical dimension, is the width of the object that is "written" on the substrate and is the limit at which a lithographic apparatus is physically able to write on a substrate. In some situations, the parameter of interest may be CD uniformity, rather than an absolute measurement of CD itself. Other parameters such as grating height and side wall angle may also be measured, if desired.

Using results from x-ray metrology apparatus 244 in combination with modeling of a target structure such as the target 30 and its diffraction properties, measurement of the shape and other parameters of the structure can be performed in a number of ways. In a first type of process, represented by FIG. 9, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit. It is expected that in T-SAXS the computation for the first type of process will not be burdensome. That being the case, there would be no need to resort to a library process.

Referring to FIG. 9 in more detail, the way the measurement of the one or more target shape and/or material properties is carried out will be described in summary. The following steps are performed. The steps will be listed here, and then explained in more detail:

S11: Receive substrate with target(s)
S12: Define measurement recipe ($\varphi$, $\theta$)
S13: Measure diffraction patterns
S14: Define model recipe
S15: Estimate shape parameters
S16: Calculate model diffraction patterns
S17: Compare measured v calculated patterns
S18: Calculate merit function
S19: Generate revised shape parameters
S20: Report one or more final shape parameters At S11 a substrate W is received with one or more metrology targets T upon it. The target will be assumed for this description to be periodic in only one direction (1-D structure). In practice it may be periodic in two directions (2-dimensional structure), and the processing will be adapted accordingly. At S12 a measurement recipe is defined, which in the enhanced method defines a range of one or more polar angles at which spectra are to be taken, and also defines a non-zero azimuthal angle. The optimum azimuthal angle for each type of target structure and manufacturing process can be determined by prior experiment and/or computational simulation. Graphs like those shown in FIG. 8 can be used to select the value or values of azimuthal angle that give the best combination of diffraction efficiencies across the diffraction orders of most interest. A recipe can be defined which measures a target using two or more azimuthal angles, if desired. However, as presently envisaged that measurements of each target will be made with a single (non-zero) value for the azimuthal angle, and a range of different polar angles.

At S13 with a target structure positioned at the spot S, diffraction patterns of the actual target on the substrate are measured using T-SAXS in an apparatus with a conical mount, as illustrated in FIG. 4. The measured diffraction patterns are captured by detector 406 forwarded to a calculation system such as processor 408. Each diffraction pattern (diffraction spectrum) corresponds to a combination of angles $\theta$ and $\varphi$. To obtain a robust measurement through reconstruction, several spectra of the same target may be captured with different angles.

Note that the diffraction patterns may be processed as detailed spectra, or they may be simplified into a set of parameters before being used in calculations. As a particular example, the diffraction pattern may be reduced simply to a set of values representing the intensity of identifiable diffraction orders, such as the diffraction orders listed in FIG. 8. The intensity may be obtained for example by identifying a peak in the diffraction spectrum that corresponds to a respective diffraction order, and assigned to that diffraction order a value corresponding to the height of the observed peak.

At S14, a 'model recipe' is established which defines a parameterized model of the target structure in terms of a number of parameters $p_i$ ($p_1$, $p_2$, $p_3$ and so on). These parameters may represent for example, in a 1-D periodic structure, the angle of a side wall, the height or depth of a feature, the width of the feature, etc. Properties of the target material and underlying layers are also represented by parameters such as refractive index (at a particular wavelength present in the x-radiation beam). Significantly, while a target structure may be defined by dozens of parameters describing its shape and material properties, the model recipe will define many of these to have fixed values, while others are to be variable or 'floating' parameters for the purpose of the following process steps. Further below, the process is described by which the choice between fixed and floating parameters is made. Moreover, ways will be introduced in which parameters can be permitted to vary without being fully independent floating parameters. For the purposes of describing FIG. 9, only the variable parameters are considered as parameters $p_i$.

At S15 a model target shape is estimated by setting initial values $p_1(0)$ for the floating parameters (i.e. $p_1(0)$, $p_2(0)$, $p_3(0)$ and so on). Each floating parameter will be generated within certain predetermined ranges, as defined in the recipe.

At S16, the parameters representing the estimated shape, together with the properties of the different materials in the model, are used to calculate the scattering properties, for example using a rigorous optical diffraction method such as RCWA or any other solver of Maxwell equations. This gives an estimated or model diffraction pattern of the estimated target shape, for each combination of angles θ and φ.

At S17 and S18 the measured diffraction patterns and the model diffraction patterns are then compared and their similarities and differences are used to calculate a "merit function" for the model target shape.

Assuming that the merit function indicates that the model needs to be improved before it represents accurately the actual target shape, control passes to step S19 where new parameters $p_1(1)$, $p_2(1)$, $p_3(1)$, etc. are estimated and fed back iteratively into step S16. Steps S16 to S18 are repeated. In order to assist the search, the calculations in step S16 further generate partial derivatives of the merit function, indicating the sensitivity with which increasing or decreasing a parameter will increase or decrease the merit function, in this particular region in the parameter space. The calculation of merit functions and the use of derivatives are generally known in the art, and will not be described here in detail.

When the merit function indicates that this iterative process has converged on a solution with a desired accuracy, control passes to step S20 and one or more of the currently estimated parameters (for example a CD value) are reported as the measurement of the actual target structure.

The computation time of this iterative process is largely determined by the forward diffraction model used, in other words by the calculation of the estimated model diffraction pattern using a rigorous diffraction theory from the estimated target structure. If more parameters are required, then there are more degrees of freedom. The calculation time increases in principle with the power of the number of degrees of freedom. The estimated or model diffraction pattern calculated at S16 can be expressed in various forms. Comparisons are simplified if the calculated pattern is expressed in the same form as the measured pattern generated in step S13. Once the value for one target has been calculated, a new target on the same substrate or a similar substrate may be measured using the same steps S13, etc., without changing the measurement recipe. Where a different type of substrate or target is to measured, or in any case where it is desired to change the measurement recipe, control passes to step S11 or S12 instead.

Figure 10:
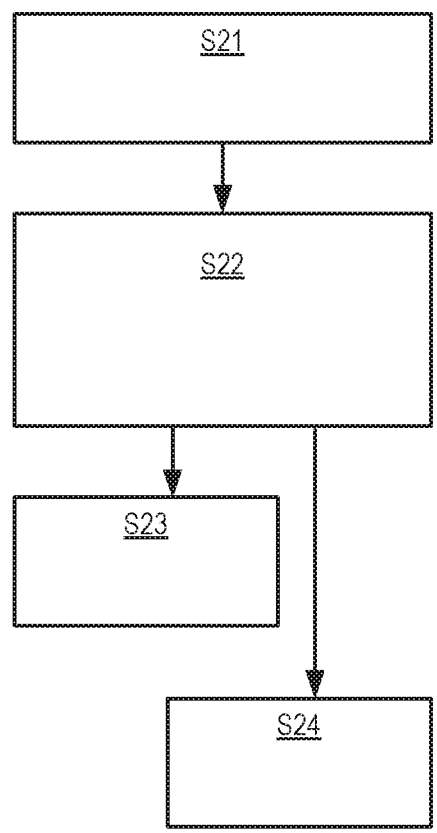
FIG. 10 is a flow chart illustrating a method of controlling performance of an metrology method and/or of a lithographic manufacturing process using measurements made by the method of FIG. 9.

FIG. 10 illustrates the application of a measurement method (for example the method of FIG. 9) in the management of a lithographic manufacturing system. The steps will be listed here, and then explained in more detail:

S21: Process substrate to produce structures on substrate
S22: Measure CD and/or other parameter across substrate
S23: Update metrology recipe
S24: Update lithography and/or process recipe At step S21, structures are produced across a substrate using the lithographic manufacturing system. At S22, the x-ray metrology apparatus and optionally other metrology apparatus and information sources are used to measure a property of the structures across the substrate. At step S23, optionally, one or more metrology recipes and calibrations of the x-ray metrology apparatus and/or of other metrology apparatus 240 are updated in light of the measurement results obtained. For example, where the x-ray metrology apparatus 244 has a lower throughput than the optical metrology apparatus 240, a few accurate measurements using x-rays can be used to improve the calculation of measurements made using the optical metrology apparatus, for a specific substrate design and process.

At step S24, measurements of CD or other parameters are compared with desired values, and used to update one or more settings of the lithographic apparatus and/or of other apparatus within the lithographic manufacturing system. By providing an x-ray metrology apparatus with improved throughput, the performance of the whole system can be improved. Product features and/or product-like features can be measured directly, even at the smallest technology nodes, and in-die targets can be provided and measured without losing too much area.

Overlay Metrology by T-SAXS

The scattering angles resulting from the product-like feature dimensions and the X-ray wavelengths mean that several orders of diffraction can be detected. In the cases of an overlay target in the X-ray waveband the contribution of both layers is additive in terms of diffraction amplitudes and there is no coupling between the top and bottom layers. However, a perfectly aligned grating and a slightly misaligned one have different diffraction peak intensities. The diffraction envelope, meaning the overall shape of the diffraction pattern, will be different. By measuring the intensity of the diffraction orders it is possible to build an empirical model to link overlay and intensities. The model may be based only on the peak intensities, or it may take into account the shapes of the peaks, or of the whole spectrum. The detailed design of the model will depend on the nature of the targets (which property is to be measured), compromises in computing power, measurement time and so forth. The shape of the diffraction peaks may for example be used to obtain some information about the target such as disorder in the targets (line edge roughness, LER). This is done by a digital processing and comparison with measurements made for example by transmission electron microscopy (TEM) or optical CD metrology (OCD). It is also feasible to reconstruct the overlay targets by modeling the diffraction process explicitly. In X-ray scattering the cross-correlations between parameters such as CD, height and so on are negligible and the measurements are insensitive to process variations.

The diffraction process of an overlay grating can be modeled as follows. Let A represent the diffracted amplitude for two gratings with features $f_1$ and $f_2$, at position $x_1$ and $x_2$. For diffraction order (h,0,0) for a monoperiodic ("1D-p") grating as used for overlay metrology, the amplitude is:

$$A = f_1 e^{2\pi x_1 h} + f_2 e^{2\pi x_2 h}$$

so that the diffraction intensity is:

$$I = |A|^2 = c + 2f_1 f_2 \cos(2\pi h)(x_2 - x_1)$$

where c is a constant. Overlay ov is defined as $x_2 - x_1$. By shifting one grating by a half-pitch over the other, we get a sine-dependency between intensity and overlay:

$$I \propto 2f_1 f_2 \sin(2\pi h \, ov)$$

with h being the order of an individual diffraction peak. Each diffraction order intensity can carry information about overlay.

The X-ray method is process robust and insensitive to non-patterned layers. It can provide an absolute overlay measurement, without relying on multiple biased targets. Multiple biased targets can be used if desired, however. However, it works best where there is a clear area for transmission, where only the two gratings of interest (level 1 and level 2) are present. This is often the case for the "front-end" of the lithographic manufacturing process (FEOL) when only a few layers have been made. Commonly these front-end layers are also the ones with most critical specifications for parameters such as overlay. It is possible to have a patterned structure in the X-ray path if it has a different pitch than the targets of interest. In principle, in that case it will be possible to differentiate the information coming for the overlay targets and from the background having a different periodicity. In general, however the presence of other structures will make in-die or in-product measurements more complex or not possible, and it will be desired to have only the two structures of interest placed on top of each other.

As mentioned above, the profile of overlay and other parameters does not need to be expressed entirely as a variation across the substrate. It can be expressed for example as an intra-field profile that is common to all fields (each instance of patterning using the patterning device M at a different location on the substrate W) and a lower order, inter-field, variation onto which the intra-field variation is repeatedly superimposed.

Hybrid Metrology System

Figure 11:
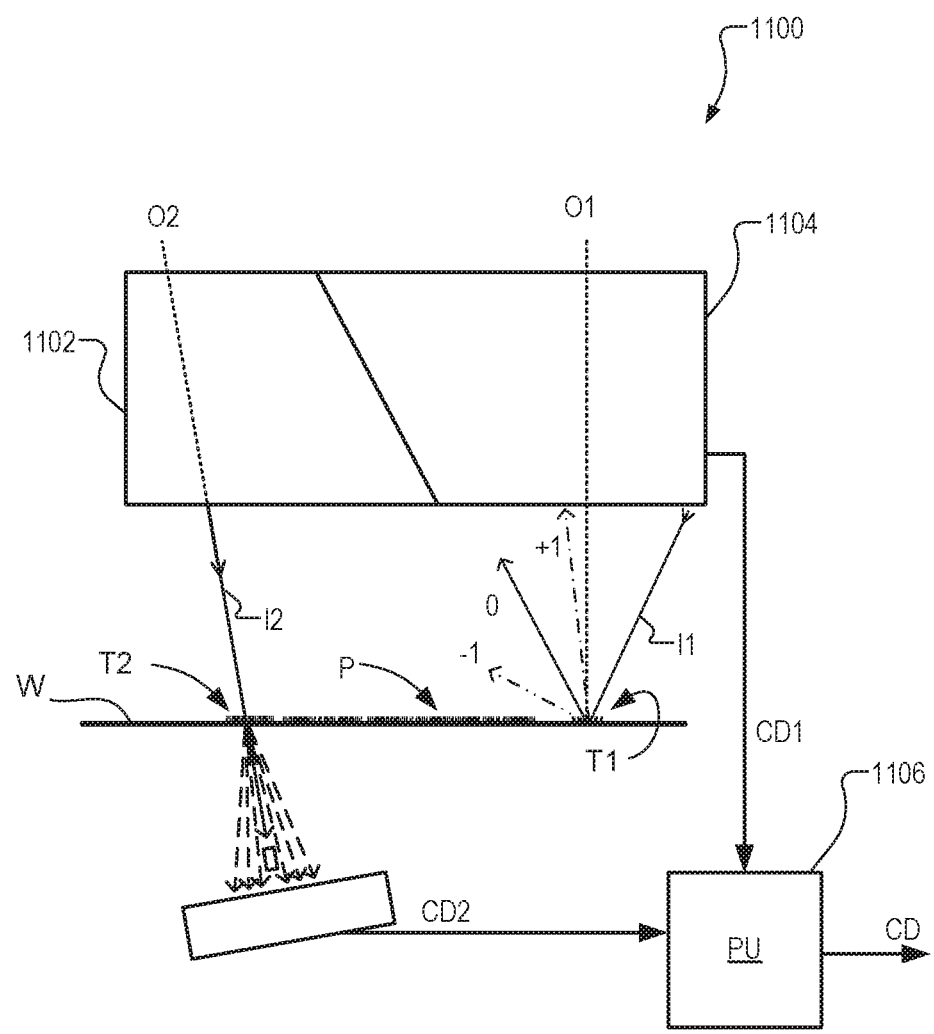
FIG. 11 depicts an embodiment of a hybrid metrology apparatus including both X-ray and optical metrology apparatus measuring different targets on a substrate.

FIG. 11 illustrates a metrology system in which a hybrid metrology apparatus 1100 apparatus includes both x-ray metrology apparatus 1102 for performing T-SAXS with a conical mount and optical metrology apparatus 1104 for performing more conventional scatterometry measurements. Both apparatuses 1102 and 1104 are illustrated working simultaneously on different parts of a same substrate W. This is purely for illustration, and the two apparatuses may in practice operate at different times, while sharing common components such as substrate handling and positioning systems. The first and second metrology apparatus may be stand-alone devices or may be incorporated with one another in a common hardware system. One or both of the first and second metrology apparatuses may be integrated with either the lithographic apparatus LA itself or within the lithographic cell LC.

The different apparatuses may measure different target structures, so that for example the optical metrology apparatus 1104 is used to measure targets T1, while x-ray metrology apparatus 1102 is used to measure targets T2. Product features P are also illustrated as being formed on the same substrate. Applications and benefits of such hybrid metrology techniques are disclosed in U.S. patent application publication no. US 2015-0331336 referenced above. The enhanced x-ray metrology apparatus and methods disclosed herein can be applied in such a hybrid system to improve throughput of the x-ray metrology steps in the hybrid method. On the other hand, when throughput of x-ray metrology is improved sufficiently to be used for small target metrology in high-volume manufacturing, then the benefits of the hybrid technique are not so significant.

As illustrated schematically in FIG. 11, individual features forming target T1 are relatively large in size, compared to product features P. Individual features forming target T2 are the same or similar in size to product features P. Target T2 may even be formed by the product features, instead of being a dedicated metrology target. Not seen in FIG. 11, the radiation spot formed by rays I2 of x-ray metrology apparatus 1102 may be larger or smaller in diameter than the illumination spot formed by rays I1 of apparatus 1104. The area occupied by target T2 may for example be two, three or four times the area occupied by target T1. An advantage of a large area is that sufficient radiation for a good measurement can be collected more quickly. An advantage of a small target area is that useful space that can be used for product features is not lost to metrology.

In one embodiment, the X-ray metrology apparatus 1102 can provide an accurate and absolute measurement of overlay, relatively unaffected by process variations, but with large targets T2 that occupy too much space to be included at many locations, especially not within product areas. Targets T1 are small enough to be provided at relatively many locations across the substrate, including within product areas, but measurements from these targets are affected by process variations and do not necessarily represent the overlay present within the product features P. In the hybrid metrology system, a processing unit 1106 processes signals from both types of targets using apparatuses 1102, 1104 together, to provide an accurate measurement of overlay at many points across the substrate.

Although for the sake of illustration FIG. 11 shows the first and second metrology apparatuses 1102, 1104 simultaneously measuring targets T1 and T2 on a substrate W, in practice the measurements can be conducted at different times and places. The targets T1 and T2 will be very small in practice compared with the size of substrate W, and many targets of each type will be formed on a real substrate.

In another implementation, as illustrated in FIG. 1, each metrology apparatus 1102 and 1104 may be a separate piece of equipment. Consequently, it is likely that all the targets T1 will be measured while the substrate is within apparatus 1104, and at a different time (either before or after) all targets T2 will be measured while the substrate is loaded within apparatus 1102.

Concerning the implementation of each metrology apparatus in more detail, in a first embodiment the optical metrology apparatus 1104 is a dark field imaging apparatus of the type mentioned in the introduction. However, it should be understood that the enhanced x-ray metrology apparatus can be used in conjunction with other types of small target metrology, for example using image-based targets.

Internal structures of apparatus 1104 and target T1 are not shown or described in detail here. Details of the structure and operation of suitable apparatus 1104, as well as suitable designs of target T1, can be found in PCT patent application publication nos. WO 2009/078708 and WO 2009/106279 which documents are hereby incorporated by reference in their entirety. These targets can be smaller than the illumination spot and may be surrounded by product structures on a substrate. Multiple gratings can be measured in one image, using a composite grating target. Further developments of the technique have been described in U.S. patent application publication nos. US 2011-0027704, US 2011-0043791, US 2012-0044470, US 2012-0123581, US 2013-0258310, and US 2013-0271740 and in PCT patent application publication no. WO 2013-178422. Any of these developments can be applied in the context of the apparatus 240/1104 of the present disclosure, and the entire contents of all these publications are also incorporated herein by reference. More detail of the hybrid metrology techniques is provided in U.S. patent application publication no. US 2015-0331336 mentioned above.

While specific embodiments have been described above, it will be appreciated that the invention may be practiced otherwise than as described. In association with the novel targets as realized on substrates and patterning devices, an embodiment may include a computer program containing one or more sequences of machine-readable instructions describing a methods of producing targets on a substrate, measuring targets on a substrate and/or processing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein.

Although patterning devices in the form of, for example, a physical reticle have been described, the term "patterning device" in this application also includes a data product conveying a pattern in digital form, for example to be used in conjunction with a programmable patterning device.

Although specific reference may have been made above to the use of embodiments in the context of optical lithography, it will be appreciated that embodiments may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
irradiating a periodic structure with x-radiation along an irradiation direction, the periodic structure having been formed by a lithographic process on a surface of a substrate and having a periodic arrangement of features with a periodicity in a first direction essentially perpendicular to a direction of elongation of the features of the periodic structure,
detecting x-radiation scattered by the periodic structure after transmission through the substrate, and
processing signals representing the detected scattered radiation to determine a property of the periodic structure,
wherein, when the x-radiation is incident on the periodic structure at the irradiation direction, both:
(i) a scalar or vector projection of the irradiation direction onto a first plane perpendicular to the surface has an oblique polar angle, as measured in the first plane, with respect to a direction normal to the substrate lying in the first plane, and
(ii) a scalar or vector projection of the irradiation direction onto a second plane perpendicular to the first plane has an oblique azimuthal angle, as measured in the second plane, with respect to the first direction laying in the second plane.

2. The method of claim 1, wherein the azimuthal angle is selected so that a diffraction efficiency of the periodic structure in one or more non-zero diffraction orders is greater than would be the case for an irradiation direction of zero azimuthal angle.

3. The method of claim 1, wherein the detecting includes detecting intensities for a plurality of diffraction orders in the scattered radiation.

4. The method of claim 1, wherein the irradiating and detecting are repeated using different polar angles and wherein, in the processing, signals representing the scattered radiation detected using a plurality of different polar angles are used to determine the property of the periodic structure.

5. The method of claim 1, wherein the processing includes defining a parameterized model of the periodic structure and using the model to perform a mathematical reconstruction of the structure based on the detected scattered radiation.

6. The method of claim 1, wherein the property is linewidth.

7. The method of claim 1, wherein the property is overlay and the periodic structure is an overlay grating formed in two or more patterning steps.

8. A device manufacturing method comprising:
transferring a functional device pattern from a patterning device onto a substrate using a lithographic process, the pattern defining at least one periodic structure;
measuring a property of the periodic structure to determine a value for a parameter of the lithographic process; and
applying a correction in subsequent operations of the lithographic process in accordance with the measured property,
wherein measuring the property of the periodic structure includes measuring a property by the method as claimed in claim 1.

9. The method of claim 2, wherein the azimuthal angle is selected so that a diffraction efficiency of the periodic structure in a first order of diffraction is more than two times the diffraction efficiency for zero azimuthal angle.

10. The method of claim 2, wherein the azimuthal angle is selected so that a diffraction efficiency of the periodic structure in a plurality of non-zero diffraction orders is greater than would be the case for an irradiation direction of zero azimuthal angle.

11. The method of claim 8, wherein the functional device pattern defines product features having a critical dimension less than 10 nm.

12. A metrology apparatus for use in measuring performance of a lithographic process, the apparatus comprising:
a substrate support configured to support a substrate;
an irradiation system configured to generate a beam of x-radiation and configured to irradiate a periodic structure on a surface of the substrate with x-radiation along an irradiation direction, the periodic structure having a periodic arrangement of features with a periodicity in a first direction essentially perpendicular to a direction of elongation of the features of the periodic structure; and
a detection system configured to detect x-radiation scattered by the periodic structure after transmission through the substrate,
wherein the substrate support is adjustable in at least two angular dimensions relative to the irradiation direction, so that the irradiation direction can be selected to have an orientation wherein, when the x-radiation is incident on the periodic structure at the irradiation direction, both:
  (i) a scalar or vector projection of the irradiation direction onto a first plane perpendicular to the surface has an oblique polar angle, as measured in the first plane, with respect to a direction normal to the substrate lying in the first plane, and
  (ii) a scalar or vector projection of the irradiation direction onto a second plane perpendicular to the first plane has an oblique azimuthal angle, as measured in the second plane, with respect to the first direction lying in the second plane.

13. The apparatus of claim 12, wherein the substrate support is adapted to receive semiconductor wafers.

14. The apparatus of claim 12, further comprising a processing system configured to process signals representing the detected scattered radiation to determine a property of the periodic structure.

15. The apparatus of claim 12, further comprising a controller configured to cause operation of the irradiation system and detection system to obtain signals representing radiation scattered by the same periodic structure using different polar angles.

16. The apparatus of claim 12, wherein the property is linewidth.

17. The apparatus of claim 12, wherein the property is overlay and the periodic structure is an overlay grating formed in two or more patterning steps.

18. The apparatus of claim 14, wherein the processing system is configured to detect intensities for a plurality of diffraction orders in the scattered radiation.

19. The apparatus of claim 14, wherein the processing system is configured to process signals representing the scattered radiation detected using a plurality of different polar angles to determine the property of the periodic structure.

20. The apparatus of claim 14, wherein the processing system is configured to perform mathematical reconstruction of the periodic structure based on the detected scattered radiation.

* * * * *